(12) United States Patent
Oda et al.

(10) Patent No.: US 11,837,449 B2
(45) Date of Patent: Dec. 5, 2023

(54) TI-NB ALLOY SPUTTERING TARGET AND PRODUCTION METHOD THEREOF

(71) Applicant: JX Nippon Mining & Metals Corporation, Tokyo (JP)

(72) Inventors: Kunihiro Oda, Ibaraki (JP); Takayuki Asano, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 383 days.

(21) Appl. No.: 16/088,118

(22) PCT Filed: Mar. 23, 2017

(86) PCT No.: PCT/JP2017/011696
§ 371 (c)(1),
(2) Date: Sep. 25, 2018

(87) PCT Pub. No.: WO2017/164302
PCT Pub. Date: Sep. 28, 2017

(65) Prior Publication Data
US 2019/0115196 A1     Apr. 18, 2019

(30) Foreign Application Priority Data

Mar. 25, 2016    (JP) ................................ 2016-062545

(51) Int. Cl.
*C23C 14/34*    (2006.01)
*H01J 37/34*    (2006.01)
(Continued)

(52) U.S. Cl.
CPC .......... *H01J 37/3426* (2013.01); *B22D 7/005* (2013.01); *C22C 1/02* (2013.01);
(Continued)

(58) Field of Classification Search
CPC .... C23C 14/3414; H01J 37/3426; C22C 1/02; C22C 14/00; C22F 1/002; C22F 1/183; C22F 1/18; B22D 7/005
(Continued)

(56) References Cited

U.S. PATENT DOCUMENTS 5,102,450 A  *  4/1992  Huang .................... C22C 14/00
                                                        75/10.65
5,224,534 A  *  7/1993  Shimizu ............... B22D 11/001
                                                          164/469
(Continued)

FOREIGN PATENT DOCUMENTS

JP      H01-290766 A        11/1989
JP      2003171759 A    *   6/2003
(Continued)

OTHER PUBLICATIONS

Han et al. "Effect of Nb on the Microstructure, Mechanical Properties, Corrosion Behavior, and Cytotoxicity of Ti-Nb Alloys", Materials, Sep. 2015; 8(9): 5986-6003 (Year: 2015).*
(Continued)

*Primary Examiner* — Rodney G McDonald
(74) *Attorney, Agent, or Firm* — HOWSON & HOWSON LLP

(57) ABSTRACT

Provided is a Ti—Nb alloy sputtering target containing 0.1 to 30 at % of Nb, the remainder of Ti and unavoidable impurities; and the Ti—Nb alloy sputtering target is characterized by having an oxygen content of 400 wtppm or less. Since the target in the present disclosure has a favorable surface texture with a low oxygen content and is readily processable due to the low hardness of the target, the Ti—Nb alloy sputtering target yields a superior effect of being able to suppress the generation of particles during sputtering.

7 Claims, 1 Drawing Sheet

(51) Int. Cl.
  *C22C 1/02* (2006.01)
  *C22C 14/00* (2006.01)
  *C22F 1/00* (2006.01)
  *C22F 1/18* (2006.01)
  *B22D 7/00* (2006.01)

(52) U.S. Cl.
  CPC .............. *C22C 14/00* (2013.01); *C22F 1/002* (2013.01); *C22F 1/183* (2013.01); *C23C 14/3414* (2013.01)

(58) Field of Classification Search
  USPC ........................................ 204/298.12, 298.13
  See application file for complete search history.

(56) References Cited

U.S. PATENT DOCUMENTS

| | | | |
|---|---|---|---|
| 6,309,556 B1 * | 10/2001 | Joyce | C23C 14/3414 428/141 |
| 6,331,484 B1 | 12/2001 | Bhowmik et al. | |
| 6,893,513 B2 * | 5/2005 | Michaluk | C22B 34/24 148/422 |
| 8,758,497 B2 | 6/2014 | Takami et al. | |
| 9,150,957 B2 | 10/2015 | Holcomb et al. | |
| 2003/0116849 A1 * | 6/2003 | Suzuki | H01L 21/28568 257/751 |
| 2003/0227068 A1 | 12/2003 | Li et al. | |
| 2004/0164420 A1 | 8/2004 | Li et al. | |
| 2004/0166693 A1 | 8/2004 | Li et al. | |
| 2010/0123249 A1 | 5/2010 | Motoyama | |
| 2011/0214987 A1 * | 9/2011 | Holcomb | C23C 14/3414 204/298.13 |
| 2014/0023868 A1 | 1/2014 | Takami et al. | |
| 2015/0044453 A1 | 2/2015 | Takazaki | |

FOREIGN PATENT DOCUMENTS

| | | | |
|---|---|---|---|
| JP | 2008-098284 A | | 4/2008 |
| JP | 2011-132563 | * | 7/2011 |
| WO | WO 2001/34870 | * | 5/2001 |
| WO | 2012/008334 A1 | | 1/2012 |

OTHER PUBLICATIONS

Machine Translation JP 2011-132563 (Year: 2011).*

* cited by examiner

1

TI-NB ALLOY SPUTTERING TARGET AND PRODUCTION METHOD THEREOF

BACKGROUND

The embodiment of the present invention relates to a Ti—Nb alloy sputtering target suitable for forming a barrier layer in the wiring of a semiconductor integrated circuit and to the production method thereof, and in particular relates to a Ti—Nb alloy sputtering target prepared via melting and to the production method.

While the trend of miniaturizing the wiring width in a large scale integrated circuit (LSI) has slowed down lately, high integration and low power consumption based on miniaturization are still being demanded, and such trend continues today in combination with the advancement of deposition techniques such as the physical vapor deposition method.

Meanwhile, materials configuring the devices have not undergone any major technological innovation, and the techniques are still at the stage of adding alloy elements to main materials in the form of repeated improvements. The Cu wiring and Ta diffusion barrier materials that were introduced around 2000 are still prevalent today. Such as Ti, Ni alloy or W is still being used as the main materials around the gate electrode. Ti, among the above, has a history of being used as a material configuring LSI, as a diffusion barrier material of Al wiring, as a silicide material of gate electrodes, or as a metal gate material in various parts.

Because the raw material of Ta is expensive, the use of Ta as a barrier material for Cu wiring results in increased production costs, and the use of Nb, which is relatively inexpensive, and Ti, which has a track record of being used as a barrier material of Al wiring, as alternative materials are being invariably considered. However, the current situation is that characteristics that surpass Ta have not yet been achieved under circumstances where the miniaturization of wiring is being advanced and the required characteristics are becoming stricter, In recent years, however, a trend of using a Co material as the Cu wiring liner material is accelerating, and the change of the material of Ta which forms a pair with the foregoing material is now also a possibility. Further, a pure Ti material for use in a metal gate is also demanded of heat resistance pursuant to the thinning of wiring, and the opportunity of adding alloys is increasing in the same manner that Ni is being switched to NiPt. While Al and Nb are recognized as the alloy additive elements to be added to Ti on a practical and experimental level, Ta, which had been considered from a relatively early stage, is now being considered once again.

A Ti—Nb alloy was generally prepared via powder metallurgy so far because it was difficult to obtain a Ti—Nb alloy via melting due to the high melting point of Nb; also plastic working of the obtained alloy ingot was difficult due to its high degree of hardness. Molding is easy based on the powder metallurgy method, however, mass production via the powder metallurgy of the Ti—Nb alloy has not yet been realized because there are often problems with the quality of the film deposited via the sputtering method; the problems are caused by high oxygen content due to the size of the raw material surface area.

Prior technologies related to a Ti alloy as a diffusion barrier layer for use in LSI are presented below. Patent Documents 1 to 3 disclose forming a barrier film formed from a titanium alloy between an insulating film and a conductive layer (wire). Patent Documents 4 to 6 disclose a Ti alloy sputtering target.

In Patent Documents 4 and 6, the targets were obtained via powder metallurgy and entail the problem of characteristic degradation caused by the oxygen content described above. Patent Document 5 discloses a Ti alloy sputtering target prepared via melting/casting, but this technology merely suggests melting Nb having an ultrahigh melting point and a Ti material, which has a melting point difference of nearly 800° C. in comparison to Nb, via vacuum skull melting, has no recognition concerning the problems related to the uniformity of melting or the problems related to the oxygen content based on the selection of raw materials, and offers no description regarding the characteristic improvement of the target.

PRIOR ART DOCUMENTS

Patent Documents

[Patent Document 1] Japanese Patent Application Publication No. 2001-110751
[Patent Document 2] Japanese Patent Application Publication No. 2008-98284
[Patent Document 3] Japanese Patent Application Publication No. 2010-123586
[Patent Document 4] Japanese Patent Application Publication No. H01-290766
[Patent Document 5] Japanese Unexamined Patent Application Publication (Translation of PCT Application) No. 2004-506814
[Patent Document 6] Japanese Patent No. 5701879

SUMMARY OF THE INVENTION

An object of the embodiment of the present invention is to provide a Ti—Nb alloy sputtering target capable of suppressing the generation of particles during sputtering. In particular, an object of the embodiment of the present invention is to provide a Ti—Nb alloy sputtering target capable of lowering the Vicker's hardness and reducing the generation of particles during sputtering, which is caused by oxygen, as a result of reducing the oxygen concentration of the target.

The present inventors discovered that the oxygen concentration can be lowered and a low-hardness Ti—Nb alloy can be prepared by properly adjusting the raw material shape and the melting conditions. Based on the foregoing discovery, the present application provides the following aspects.

1) A Ti—Nb alloy sputtering target containing 0.1 to 30 at % of Nb, the remainder is Ti and unavoidable impurities, and an oxygen content of the Ti—Nb alloy sputtering target is 400 wtppm or less.

2) The Ti—Nb alloy sputtering target according to 1) above, wherein a variation in the oxygen content is within 20%.

3) The Ti—Nb alloy sputtering target according to 1) or 2) above, wherein a Vicker's hardness of the Ti—Nb alloy sputtering target is 400 Hv or less.

4) The Ti—Nb alloy sputtering target according to 3) above, wherein a variation in the Vicker's hardness is within 10%.

5) The Ti—Nb alloy sputtering target according to any one of 1) to 4) above, wherein a surface roughness Ra of the Ti—Nb alloy sputtering target is 1.0 μm or less.

6) The Ti—Nb alloy sputtering target according to any one of 1) to 5) above, wherein a purity of the Ti—Nb alloy sputtering target is 4N or higher.

7) The Ti—Nb alloy sputtering target according to any one of 1) to 6) above, wherein a relative density of the Ti—Nb alloy sputtering target is 99.9% or higher.

8) A method of producing a Ti—Nb alloy sputtering target, wherein a Ti material having a thickness from 1 mm to 5 mm and an equal side length from 10 mm to 50 mm, and a Nb material having a thickness from 0.5 mm to 2 mm and a width from 2 mm to 50 mm are prepared, the Ti material is subsequently placed in a vacuum melting furnace and melted, the Nb material is thereafter added to alloy Ti—Nb, a resulting alloy molten metal is cast in a crucible to prepare an ingot, and an obtained Ti—Nb alloy ingot is subject to plastic working into a target shape.

9) The method of producing a Ti—Nb alloy sputtering target according to 8) above, wherein the Ti material is placed in the vacuum melting furnace and melted, and the Nb material is thereafter added multiple times.

The embodiment of the present invention enables to reduce the hardness of a Ti—Nb sputtering target prepared via melting/casting and reduce the generation of particles during sputtering, which is caused by oxygen, as a result of reducing the oxygen concentration of the target. Moreover, because the reduction of hardness improves the workability and machinability of the target and enables the realization of a favorable surface texture, the embodiment of the present invention yields a superior effect of being able to suppress abnormal discharge caused by the processing marks on the target surface.

DETAILED DESCRIPTION

The embodiment of the present invention relates to a Ti—Nb alloy sputtering target prepared via melting/casting, and the constituents thereof are 0.1 to 30 at % of Nb, and the remainder being Ti and unavoidable impurities. In the sputtering target of the embodiment of the present invention, when the Nb content is less than 0.1 at %, the effect of improving the film properties (adhesion, heat resistance) of the Ti film cannot be attained. Meanwhile, when the Nb content exceeds 30 at %, unmelted Nb will remain during the melting process, and it is difficult to achieve the uniform properties of the material. Thus, the Nb content is set to be within the foregoing range.

Because the sputtering target of the embodiment of the present invention is prepared via melting/casting, not only is it possible to reduce the oxygen content in comparison to the powder sintering method, the embodiment of the present invention is able to additionally reduce the amount of oxygen; specifically, the embodiment of the present invention is able to achieve an oxygen content of 400 wtppm or less, by adjusting the raw material shape. It is thereby possible to lower the hardness of the target, and suppress the generation of particles during sputtering caused by oxygen.

Moreover, the embodiment of the present invention can cause the variation in the foregoing oxygen content to be within 20%. When the variation in the oxygen concentration exceeds 20%, this is undesirable because the target in-plane hardness will also become varied, and a uniform surface texture cannot be obtained. In order to inhibit the variation in the oxygen content, it is necessary to cut the input material of Nb (melting point: 2469° C.), which is a high melting point metallic material, into small pieces to the extent possible, but when the raw material is cut too small, the amount of oxygen that becomes adsorbed on the surface will increase. Thus, the adjustment of the input material size is extremely important. The embodiment of the present invention resolves the contradictory problems of oxygen content and its variation by strictly controlling the input material size as described later.

Figure 1:
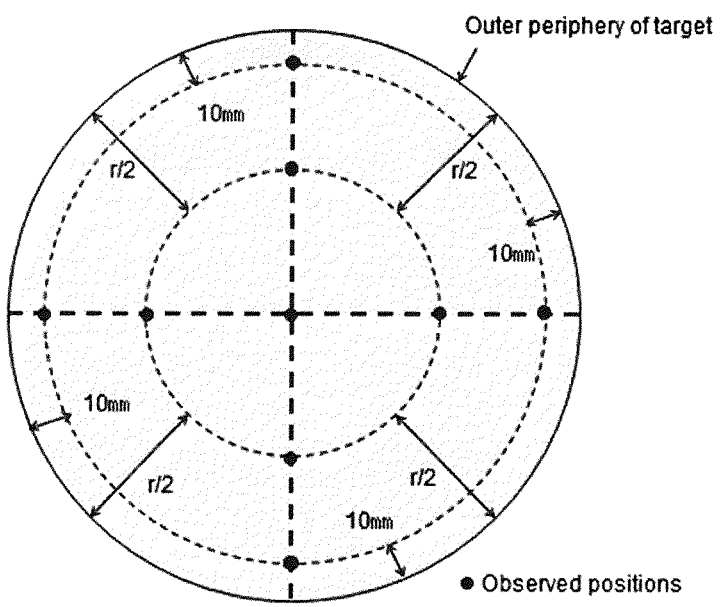
FIG. 1 is a diagram showing the respective measurement locations of the sputtering target.

The variation in the oxygen content was measured as follows. Specifically, as shown in FIG. 1, the oxygen content of the respective pieces (0.5 to 1 g) sampled from 9 in-plane locations of the target (1 location at the center, 4 locations positioned at ½ the radius on two orthogonal diameters, and 4 locations positioned 10 mm inward from the outer periphery thereof) was measured based on the DECO method. The variation in the oxygen content was calculated based on the following formula:

$$\text{Variation (\%) in oxygen content} = (\text{maximum value} - \text{minimum value})/\text{mean value} \times 100$$

The Ti—Nb alloy sputtering target of the embodiment of the present invention preferably has a Vicker's hardness of 400 Hv or less, more preferably 300 Hv or less, and most preferably 200 Hv or less. As the Vicker's hardness is lower, plastic working and cutting work can be facilitated, and the target can be processed into a favorable final shape. And a favorable surface texture yields a superior effect of being able to suppress the generation of particles during sputtering.

A metal or an alloy to is typically reduces in hardness as the purity becomes higher. Thus, in order to obtain a low-hardness material, it is considered to reduce the amount of impurities by improving a purification technique. However, in such a case, there is a problem that an additional purification process is required and that the production cost will increase. Moreover, oxygen is a gas component and, unlike other metal impurities, there is a limit in the reduction thereof based on a normal purification process. The embodiment of the present invention focuses on the oxygen in the target (raw material), and realizes a high low-hardness target by reducing the oxygen concentration as much as possible, even when the target (raw material) has a purity of 4N to 5N.

The in-plane variation in the Vicker's hardness of the foregoing Ti—Nb alloy sputtering target is preferably within 10%. When the in-plane variation of the Vicker's hardness exceeds 10%, the surface texture may change depending on the location, and uniform deposition may become difficult. In the embodiment of the present invention, the variation in the Vicker's hardness was measured as follows. Specifically, as shown in FIG. 1, the hardness of the respective pieces (0.5 to 1 g) sampled from 9 in-plane locations of the target (1 location at the center, 4 locations positioned at ½ the radius on two orthogonal diameters, and 4 locations positioned 10 mm inward from the outer periphery thereof) was measured based on the Vicker's hardness measurement method of JIS Z 2244. The variation in the hardness was calculated based on the following formula.

$$\text{Variation (\%) in Vicker's hardness} = (\text{maximum value} - \text{minimum value})/\text{mean value} \times 100$$

According to the embodiment of the present invention, the surface roughness Ra of the sputtering target is preferably 1.0 µm or less. As described above, because the embodiment of the present invention is able to lower the hardness of the Ti—Nb alloy target, cutting work can be easily performed to the target, and it is thereby possible to prepare a target with a superior surface texture having a surface roughness Ra of 1.0 μm or less. It is thereby possible to improve the deposition properties.

The surface roughness of the embodiment of the present invention was obtained by measuring the surface roughness of 9 in-plane locations of the target (1 location at the center, 4 locations positioned at ½ the radius on two orthogonal diameters, and 4 locations positioned 10 mm inward from the outer periphery thereof), as shown in FIG. 1, and by averaging the total of the surface roughness based on the surface texture measurement method of JIS B 0601.

Figure 2:
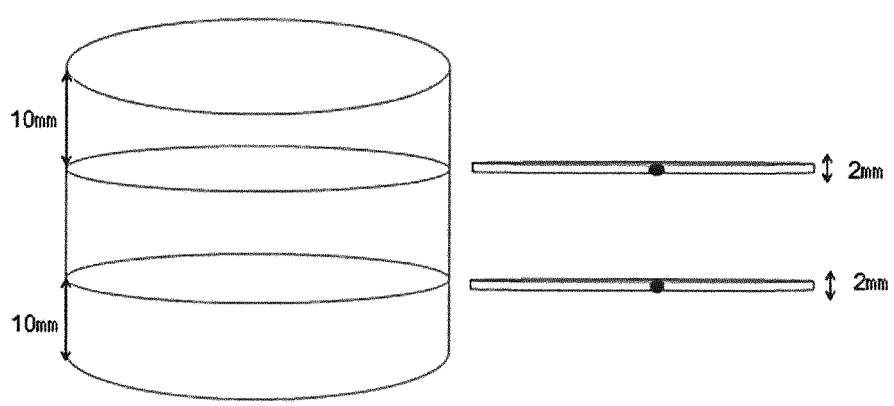
FIG. 2 is a diagram showing the purity measurement locations of the sputtering target.

In the embodiment of the present invention, the purity is preferably 4N (99.99%) or higher and 5N (99.999%) or less. Here, a purity of 4N means that the total value of Na, Al, Si, K, Cr, Mn, Fe, Co, Ni, Cu, Zn, and Zr analyzed via the glow discharge mass spectrometric analysis method (GDMS) is less than 100 ppm. This is because when impurities are contained in a large amount, there are cases where the film properties become deteriorated and the intended film characteristics cannot be obtained. Moreover, because the purity and hardness of a Ti—Nb alloy are of a proportional relation, the hardness can be lowered by increasing the purity. In the embodiment of the present invention, the purity was measured as follows. As shown in FIG. 2, disk-shaped samples were prepared by slicing into parts having a thickness of 2 mm positioned 10 mm inward from the top face and the bottom face of the ingot (target material), pieces (2 mm×2 mm×15 mm) were sampled from the center of the samples, and analyzed via GDMS to measure the foregoing impurity content.

With a Nb raw material, the purity containing Ta is often indicated as being roughly 2N because it is generally difficult to eliminate Ta impurities. However, since the existence of Ta does not impair the characteristics of barrier usage, the Nb purity can be calculated based on metal impurities excluding Ta as indicated above.

Since the Ti—Nb alloy sputtering target is prepared via casting in the embodiment of the present invention, the density becomes higher in comparison to that of a target prepared by sintering a powder. While the relative density of a sintered body (target material) prepared by sintering a powder is roughly 97%, the case of the embodiment of the present invention can achieve a relative density of 99.9% or higher. This kind of high density target can contribute to the suppression of particles. The term "relative density" in the embodiment of the present invention refers to the ratio of the measured density of Ti—Nb, which is evaluated based on the Archimedes method, relative to the theoretical density of Ti—Nb, as expressed in the following formula:

Relative density (%)=(Archimedes density/theoretical density)×100

Here, the theoretical density of Ti—Nb is expressed based on the following formula when the ratio of Nb atoms in the target is N (%):

Theoretical density (g/cm$^3$)=(4787−45.04×N)/(1061−0.227×N)

The Ti—Nb alloy sputtering target of the embodiment of the present invention can be produced by the following method. Foremost, a Ti raw material having a purity of 4N or higher and a Nb raw material having a purity of 4N or higher are prepared in an amount to attain the intended atomic ratio. Here, it is desirable to use raw materials that have a small surface area because the oxygen concentration will increase when the surface area of the raw materials is large. In particular, the Ti material is preferably formed in a tile-like shape having a thickness of 1 mm or more and 5 mm or less and an equal side length of 10 mm or more and 50 mm or less, and the Nb material is preferably formed in a plate shape or a ribbon shape having a thickness of having a thickness from 0.5 mm to 2 mm and a width from 2 mm to 50 mm and a length chosen suitably. Raw materials having the foregoing shapes can be prepared by controlling, to a certain size, the mill ends prepared by cutting and grinding the respective metal material ingots. The raw materials are washed, degreased and, as needed, pickled in order to remove contamination.

The raw materials are placed in a vacuum skull melting furnace equipped with a water-cooled copper crucible of φ150 mm×200 mmL, and then melted. Here, the Nb raw material is added multiple times after confirming that only the Ti raw material has melted. This is because, while melting is possible even when the Nb raw material is simultaneously added together with the Ti material when the Nb content is within the range of 0.1 to 3 at %, when the Nb content is within the range of 3 to 30 at %, the uniformity of the melted material (including the oxygen in the material) can be favorably retained by subsequently adding the Nb material multiple times.

It is thereby possible to promote the melting/synthesizing of a low Nb composition and maintain the fluidity of the molten metal at a melting temperature that is considerably lower than the Nb melting point of 2469° C., and the composition can be precisely controlled without any dispersion or volatilization of Ti (melting point: 1668° C.) that is exposed to a high temperature near the melting point of Nb.

Next, the molten metal of the Ti—Nb alloy obtained by melting and synthesizing all raw materials prepared in the intended composition is cooled in a water-cooled copper crucible to prepare a Ti—Nb alloy ingot. The prepared ingot is thereafter subject to hot forging at 700 to 1200° C., and then subject to hot rolling at 700 to 1000° C. Secondary forging and secondary rolling may also be performed as needed. The embodiment of the present invention is not limited by the foregoing processes, and the number of times and temperature of forging and rolling may be suitably selected for obtaining the intended shape or texture.

Next, the surface of the Ti—Nb alloy that was subject to the foregoing plastic working is machined via cutting and polishing to obtain the intended surface texture. Based on the above processes, a Ti—Nb alloy sputtering target having the features of the present disclosure can be produced. The thus obtained target can suppress the generation of particles during sputtering, and improve the adhesion and heat resistance of the formed film.

EXAMPLES

Hereinafter, description will be given based on examples. This embodiment is merely an example for facilitating understanding, and is not limited by this example at all. That is, the present invention is limited only by the scope of the claims, and includes various modifications other than the embodiments described in the present invention.

Example 1

A Ti raw material (purity of 4N or higher) having an equal side length of 30 mm and a thickness of 2 mm and a ribbon-shaped Nb raw material (purity of 4N or higher excluding Ta) having a width of 10 mm, a length of 50 mm, and a thickness of 1 mm were prepared, these materials were weighed so that the Ti content is 99.9 at % and the Nb content is 0.1 at %, and then placed in a melting furnace. Then, the resulting product was subject to vacuum skull melting at a power output that would melt the Ti material to obtain a Ti—Nb alloy, and the resulting alloy molten metal was cooled in a water-cooled copper crucible. Subsequently, the Ti—Nb alloy ingot was subject to hot forging at 700° C., and to hot rolling at 700° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 380 wtppm (variation: 18%), the relative density was 100%, the Vicker's hardness was 150 Hv (variation: 10%), and the surface roughness Ra was 0.4 μm. The sputtering conditions were as follows; namely, input power of 15 kw and Ar gas flow of 8 sccm, and, after performing pre-sputtering at 75 kWhr, a film was deposited on a silicon substrate having a 12-inch diameter for 15 seconds. The number of particles having a size of 0.1 μm or larger that adhered to the substrate was 3. As a result of a heat test performed at 700° C. on the formed film, peeling and other defects were not observed. The film exhibited favorable adhesion and heat resistance.

Example 2

A Ti raw material (purity of 4N or higher) having an equal side length of 30 mm and a thickness of 2 mm and a ribbon-shaped Nb raw material (purity of 4N or higher excluding Ta) having a width of 10 mm, a length of 50 mm, and a thickness of 1 mm were prepared, and weighed so that the Ti content is 98 at % and the Nb content is 2 at %, and then placed in a melting furnace. Then, the resulting product was subject to vacuum skull melting at a power output that would melt the Ti material to obtain a Ti—Nb alloy, and the resulting alloy molten metal was cooled in a water-cooled copper crucible. Subsequently, the Ti—Nb alloy ingot was subject to hot forging at 700° C., and to hot rolling at 700° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 350 wtppm (variation: 18%), the relative density was 100%, the Vicker's hardness was 180 Hv (variation: 10%), and the surface roughness Ra was 0.4 μm. The sputtering conditions were as follows; namely, input power of 15 kw and Ar gas flow of 8 sccm, and, after performing pre-sputtering at 75 kWhr, a film was deposited on a silicon substrate having a 12-inch diameter for 15 seconds. The number of particles having a size of 0.1 μm or larger that adhered to the substrate was 3. As a result of a heat test performed at 700° C. on the formed film, peeling and other defects were not observed. The film exhibited favorable adhesion and heat resistance.

Example 3

A Ti raw material (purity of 4N or higher) having an equal side length of 50 mm and a thickness of 5 mm and a ribbon-shaped Nb raw material (purity of 4N or higher excluding Ta) having a width of 10 mm, a length of 50 mm, and a thickness of 1 mm were prepared, these materials were weighed so that the Ti content is 97 at % and the Nb content is 3 at %. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the Nb material was added 10 separate times. After obtaining a Ti—An alloy, the resulting alloy molten metal was cooled in a water-cooled copper crucible. Subsequently, the Ti—Nb alloy ingot was subject to hot forging at 1200° C., and to hot rolling at 1000° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 330 wtppm (variation: 17%), the relative density was 100%, the Vicker's hardness was 190 Hv (variation: 8%), and the surface roughness Ra was 0.4 μm. The thus obtained target was mounted on a sputtering device, and then sputtered. Here, the sputtering conditions were the same as Example 1. The number of particles having a size of 0.1 μm or larger that adhered to the substrate was 5. As a result of a heat test performed at 700° C. on the formed film, peeling and other defects were not observed. The film exhibited favorable adhesion and heat resistance.

Example 4

A Ti raw material (purity of 4N or higher) having an equal side length of 50 mm and a thickness of 5 mm and a ribbon-shaped Nb raw material (purity of 4N or higher excluding Ta) having a width of 10 mm, a length of 50 mm, and a thickness of 1 mm were prepared, these materials were weighed so that the Ti content is 90 at % and the Nb content is 10 at %. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the Nb material was added 10 separate times. After obtaining a Ti—An alloy, the resulting alloy molten metal was cooled in a water-cooled copper crucible. Subsequently, the Ti—Nb alloy ingot was subject to hot forging at 1200° C., and to hot rolling at 1000° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 260 wtppm (variation: 15%), the relative density was 100%, the Vicker's hardness was 220 Hv (variation: 8%), and the surface roughness Ra was 0.5 μm. The thus obtained target was mounted on a sputtering device, and then sputtered. Here, the sputtering conditions were the same as Example 1. The number of particles having a size of 0.1 μm or larger that adhered to the substrate was 9. As a result of a heat test performed at 700° C. on the formed film, peeling and other defects were not observed. The film exhibited favorable adhesion and heat resistance.

Example 5

A Ti raw material (purity of 4N or higher) having an equal side length of 50 mm and a thickness of 5 mm and a ribbon-shaped Nb raw material (purity of 4N or higher excluding Ta) having a width of 10 mm, a length of 50 mm, and a thickness of 1 mm were prepared, these materials were weighed so that the Ti content is 80 at % and the Nb content is 20 at %. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the Nb material was added 10 separate times. After obtaining a Ti—An alloy, the resulting alloy molten metal was cooled in a water-cooled copper crucible. Subsequently, the Ti—Nb alloy ingot was subject to hot forging at 1200° C., and to hot rolling at 1000° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 200 wtppm (variation: 9%), the relative density was 100%, the Vicker's hardness was 360 Hv (variation: 8%), and the surface roughness Ra was 0.7 μm. The thus obtained target was mounted on a sputtering device, and then sputtered. Here, the sputtering conditions were the same as Example 1. The number of particles having a size of 0.1 μm or larger that adhered to the substrate was 7. As a result of a heat test performed at 700° C. on the formed film, peeling and other defects were not observed. The film exhibited favorable adhesion and heat resistance.

Example 6

A Ti raw material (purity of 4N or higher) having an equal side length of 50 mm and a thickness of 5 mm and a ribbon-shaped Nb raw material (purity of 4N or higher excluding Ta) having a width of 10 mm, a length of 50 mm, and a thickness of 1 mm were prepared, these materials were weighed so that the Ti content is 70 at % and the Nb content is 30 at %. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the Nb material was added 10 separate times. After obtaining a Ti—An alloy, the resulting alloy molten metal was cooled in a water-cooled copper crucible. Subsequently, the Ti—Nb alloy ingot was subject to hot forging at 1200° C., and to hot rolling at 1000° C. The Ti—Nb alloy that was subject to the foregoing plastic working was thereafter machined via cutting and polishing to obtain the intended surface texture.

The oxygen content, relative density, Vicker's hardness, and surface roughness of the sputtering target obtained with the above processes were examined. Consequently, the oxygen content was 160 wtppm (variation: 6%), the relative density was 100%, the Vicker's hardness was 390 Hv (variation: 7%), and the surface roughness Ra was 0.8 μm. The thus obtained target was mounted on a sputtering device, and then sputtered. Here, the sputtering conditions were the same as Example 1. The number of particles having a size of 0.1 μm or larger that adhered to the substrate was 6. As a result of a heat test performed at 700° C. on the formed film, peeling and other defects were not observed. The film exhibited favorable adhesion and heat resistance.

Comparative Example 1

A Ti raw material (purity of 4N or higher) and a Nb raw material (purity of 4N or higher excluding Ta) having an equal side length of 60 mm and a thickness of 10 mm were prepared, these materials were weighed so that the Ti content is 99.9 at % and the Nb content is 0.1 at %, and then placed in a melting furnace. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the square Nb material was added at once. The resulting alloy molten metal was thereafter cooled in a water-cooled copper crucible. Subsequently, the Ti—Nb alloy ingot was subject to hot forging at 700° C., and to hot rolling at 700° C. Nevertheless, due to an unmelted Nb material, the Ti—Nb alloy ingot cracked during the forging process or the rolling process, and could not be processed into a target material.

As this material was analyzed, the composition varied within a range of 0.1 to 0.4 at %, the relative density could not be measured, the oxygen content was 360 wtppm (variation: 20%), and the Vicker's hardness was 220 Hv (variation: 23%).

Comparative Example 2

A Ti raw material (purity of 4N or higher) and a Nb raw material (purity of 4N or higher excluding Ta) having an equal side length of 60 mm and a thickness of 10 mm were prepared, and these materials were weighed so that the Ti content is 90 at % and the Nb content is 10 at %. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the square Nb material was added at once. Subsequently, the Ti—Nb alloy ingot was subject to hot forging at 1000° C., and to hot rolling at 1000° C. Nevertheless, an unmelted Nb material was observed, the Ti—Nb alloy ingot cracked slightly during the forging process or the rolling process.

As this material was analyzed, the composition varied within a range of 5 to 40 at %, the relative density could not be measured, the oxygen content was 280 wtppm (variation: 30%), and the Vicker's hardness was 220 Hv (variation: 30%).

Comparative Example 3

A Ti raw material (purity of 4N or higher) and a Nb raw material (purity of 4N or higher excluding Ta) having an equal side length of 30 mm and a thickness of 2 mm were prepared, these materials were weighed so that the Ti content is 70 at % and the Nb content is 30 at %, and then placed in a melting furnace. The Ti material was foremost placed in a melting furnace, and the Nb material was set in a raw material feeding mechanism for supplementary addition. Then, the resulting product was subject to vacuum skull melting at a power output that would melt the Ti material and, after confirming that the Ti raw material has melted, the square Nb material was added at once. Subsequently, the resulting product was subject to vacuum skull melting at a power output that would melt the Nb material, but the dispersion of the Ti material was severe and the amount of Ti was reduced, and deviated from the prescribed composition.

As this material was analyzed, the composition varied within a range of 8 to 75 at %, the relative density could not be measured, the oxygen content was 220 wtppm (variation: 31%), and the Vicker's hardness was 330 Hv (variation: 30%).

Comparative Example 4

A Ti powder and a Nb powder were prepared to attain an atomic composition ratio of 70:30, these powders were mixed, and thereafter sintered via vacuum hot press by being held for 2 hours at a temperature of 1300° C. The obtained Ti—Nb alloy sintered body was thereafter machined via grinding and polishing to obtain the intended surface texture.

The oxygen content, relative density, Vicker's hardness, and surface roughness of the sputtering target obtained with the above processes were examined. Consequently, the oxygen content was 1500 wtppm (variation: 25%), the relative density was 98%, the Vicker's hardness was 450 Hv (variation: 16%), and the surface roughness Ra was 1.2 μm. The thus obtained target was mounted on a sputtering device, and then sputtered. Here, the sputtering conditions were the same as Example 1. The number of particles having a size of 0.1 μm or larger that adhered to the substrate was 1200. As a result of a heat test performed at 700° C. on the formed film, the peeling was observed.

Comparative Example 5

A Ti raw material and a Nb raw material were prepared to attain an atomic composition ratio of 90:10; these powders were powderized via atomization treatment, and thereafter sintered via vacuum hot press by being held for 2 hours at a temperature of 1300° C. The obtained Ti—Nb alloy sintered body was thereafter machined via cutting and polishing to obtain the intended surface texture.

The oxygen content, relative density, Vicker's hardness, and surface roughness of the sputtering target obtained with the above processes were examined. Consequently, the oxygen content was 800 wtppm (variation: 15%, the relative density was 98%, the Vicker's hardness was 420 Hv (variation: 10%), and the surface roughness Ra 1.0 μm. The thus obtained target was mounted on a sputtering device, and then sputtered. Here, the sputtering conditions were the same as Example 1. The number of particles having a size of 0.1 μm or larger that adhered to the substrate was 350. As a result of a heat test performed at 700° C. on the formed film, peeling was observed.

The foregoing results are shown in Table 1.

TABLE 1

| | Composition | Production method | Form and method of adding Nb raw material | Condition of target | Composition range (at %) | Oxygen content (wt ppm) |
|---|---|---|---|---|---|---|
| Example 1 | Ti-0.1 at % Nb | Melting/Casting | Ribbon-shaped Nb, added at a time | Favorable | 0.09 to 0.10 | 380 |
| Example 2 | Ti-2 at % Nb | Melting/Casting | Ribbon-shaped Nb, added at a time | Favorable | 1.9 to 2.1 | 350 |
| Example 3 | Ti-3 at % Nb | Melting/Casting | Ribbon-shaped Nb, added 10 separate times | Favorable | 2.9 to 3.1 | 330 |
| Example 4 | Ti-10 at % Nb | Melting/Casting | Ribbon-shaped Nb, added 10 separate times | Favorable | 9.9 to 10.2 | 260 |
| Example 5 | Ti-20 at % Nb | Melting/Casting | Ribbon-shaped Nb, added 10 separate times | Favorable | 19.8 to 20.2 | 200 |
| Example 6 | Ti-30 at % Nb | Melting/Casting | Ribbon-shaped Nb, added 10 separate times | Favorable | 29.6 to 30.1 | 160 |
| Comparative Example 1 | Ti-0.1 at % Nb | Melting/Casting | Square Nb, added at a time | Unmelted Ta, rolling was impossible | 0.1 to 0.4 | 360 |
| Comparative Example 2 | Ti-10 at % Nb | Melting/Casting | Square Nb, added at a time | Unmelted Ta, slight crack during plastic working | 5 to 40 | 280 |
| Comparative Example 3 | Ti-30 at % Nb | Melting/Casting | Square Nb, added at a time | Compositional deviation after melting | 8 to 75 | 220 |
| Comparative Example 4 | Ti-30 at % Nb | Powder metallurgy | Mixed powder | Processing resistant | 29.8 to 30.1 | 1500 |
| Comparative Example 5 | Ti-10 at % Nb | Powder metallurgy | Alloy atomized powder | Processing resistant | 9.9 to 10.1 | 800 |

| | Oxygen variation (%) | Relative density (%) | Vickers hardness (Hv) | Hardness variation (%) | Surface roughness (μm) | Number of particles (0.1 μm or larger) | Heat test result |
|---|---|---|---|---|---|---|---|
| Example 1 | 18 | 100 | 150 | 10 | 0.4 | 3 | No separation and other defects |
| Example 2 | 18 | 100 | 180 | 10 | 0.4 | 3 | No separation and other defects |

TABLE 1-continued

| | | | | | | | |
|---|---|---|---|---|---|---|---|
| Example 3 | 17 | 100 | 190 | 8 | 0.4 | 5 | No separation and other defects |
| Example 4 | 15 | 100 | 220 | 8 | 0.5 | 9 | No separation and other defects |
| Example 5 | 9 | 100 | 360 | 8 | 0.7 | 7 | No separation and other defects |
| Example 6 | 6 | 100 | 390 | 7 | 0.8 | 6 | No separation and other defects |
| Comparative Example 1 | 20 | — | 220 | 23 | — | — | — |
| Comparative Example 2 | 30 | — | 220 | 30 | — | — | — |
| Comparative Example 3 | 31 | — | 330 | 30 | — | — | — |
| Comparative Example 4 | 25 | 98 | 450 | 16 | 1.2 | 1200 | Separation |
| Comparative Example 5 | 15 | 98 | 420 | 10 | 1.0 | 350 | Separation |

The embodiment of the present invention yields a superior effect of being able to suppress the generation of particles during sputtering, since the Ti—Nb alloy sputtering target of the embodiment of the present invention has a favorable surface texture with a low oxygen content and is readily processable due to its low-hardness. The embodiment of the present invention is beneficial as a Ti—Nb alloy sputtering target suitable for forming thin films for use in the device wiring of a semiconductor integrated circuit.

The invention claimed is:

1. A Ti—Nb alloy sputtering target having a composition consisting of Nb in an amount of 0.1 to 30 at % and the remainder being Ti and unavoidable impurities, an oxygen content of 400 wtppm or less, a Vicker's hardness of 150 Hv to 400 Hv, and a variation in Vicker's hardness within 10%, wherein the variation in Vicker's hardness is calculated based on the following formula: Variation (%) in Vicker's hardness=100×(maximum value of sampled locations−minimum value of sampled locations)/mean value of sampled locations.

2. The Ti—Nb alloy sputtering target according to claim 1 having a purity of 4N or higher.

3. The Ti—Nb alloy sputtering target according to claim 2 having a relative density of 99.9% or higher.

4. The Ti—Nb alloy sputtering target according to claim 1 having a relative density of 99.9% or higher.

5. A method of producing a Ti—Nb alloy sputtering target, the method comprising the steps of:
preparing a Ti material formed in a tile shape having a thickness from 1 mm to 5 mm and an equal side length from 10 mm to 50 mm and a Nb material formed in a plate shape or a ribbon shape having a thickness from 0.5 mm to 2 mm and a width from 2 mm to 50 mm;
placing the Ti material of the tile shape in a vacuum melting furnace to be melted;
adding the Nb material of the plate-shaped or ribbon-shaped in the vacuum melting furnace to alloy Ti—Nb;
casting a resulting alloy molten metal in a water-cooled copper crucible to prepare an ingot; and
subjecting an obtained Ti—Nb alloy ingot to plastic working into a target shape to produce a Ti—Nb alloy sputtering target, wherein the Ti—Nb alloy sputtering target has a variation in oxygen content of within 18%.

6. The method of producing a Ti—Nb alloy sputtering target according to claim 5, wherein, after the Ti material of the tile shape is placed in the vacuum melting furnace and melted, the Nb material is then added in the vacuum melting furnace in the form of separate pieces at multiple separate times.

7. The method according to claim 6, wherein the vacuum melting furnace is a vacuum skull melting furnace including a water-cooled copper crucible.

* * * * *